United States Patent
Bickerstaff et al.

(10) Patent No.: US 7,437,650 B2
(45) Date of Patent: Oct. 14, 2008

(54) PRE-EMPTIVE INTERLEAVER ADDRESS GENERATOR FOR TURBO DECODERS

(75) Inventors: Mark Andrew Bickerstaff, Carlingford (AU); Yi-Chen Li, Sydney (AU); Chris Nicol, Castle Hill (AU); Bejamin John Widdup, Glenwood (AU)

(73) Assignee: Agere Systems Inc., Allentown, PA (US)

( * ) Notice: Subject to any disclaimer, the term of this patent is extended or adjusted under 35 U.S.C. 154(b) by 725 days.

(21) Appl. No.: 11/103,489

(22) Filed: Apr. 12, 2005

(65) Prior Publication Data

US 2006/0242476 A1 Oct. 26, 2006

(51) Int. Cl.
*H03M 13/27* (2006.01)
*H03M 13/29* (2006.01)

(52) U.S. Cl. .................................. 714/755; 714/788
(58) Field of Classification Search ................ 714/755, 714/788
See application file for complete search history.

(56) References Cited

U.S. PATENT DOCUMENTS

| 6,314,534 | B1* | 11/2001 | Agrawal et al. | 714/702 |
|---|---|---|---|---|
| 6,323,788 | B1* | 11/2001 | Kim et al. | 341/81 |
| 6,549,998 | B1* | 4/2003 | Pekarich et al. | 711/220 |
| 6,625,234 | B1* | 9/2003 | Cui et al. | 375/341 |
| 6,668,343 | B1* | 12/2003 | Kim et al. | 714/702 |
| 6,721,908 | B1* | 4/2004 | Kim et al. | 714/702 |
| 6,845,482 | B2* | 1/2005 | Yao et al. | 714/755 |
| 6,851,039 | B2* | 2/2005 | Bickerstaff | 711/219 |
| 6,854,077 | B2* | 2/2005 | Chen et al. | 714/702 |
| 6,871,303 | B2* | 3/2005 | Halter | 714/702 |
| 7,051,261 | B1* | 5/2006 | Dhamankar | 714/755 |
| 7,058,874 | B2* | 6/2006 | Zhou | 714/756 |

OTHER PUBLICATIONS

Mark A. Bickerstaff et al., A Unified Turbo/Viterbi Channel Decoder for 3GPP Mobile Wireless in 0.18—μm CMOS, IEEE Journal of Solid-State Circuits Conference, Nov. 2002, 1555-1563.
Myoung-Cheol Shin & In Cheol Park, A Programmable Turbo Decoder for Multiple 3G Wireless Standards, 2003 IEEE International Solid-State Circuits Conference, 2003, Session 8, Paper 8.7.
Mark A. Bickerstaff et al., A 24Mb/s Radix 4 LogMAP Turbo Decoder for 3GPP-HSDPA Mobile Wireless, IEEE International Solid State Circuits Conference, 2003, Session 8, Paper 8.5.
3rd Generation Partnership Project; Technical Specification Group Radio Access Network; Multiplexing and channel coding (FDD) (Release 6), 3GPP TS 25.212 V6.2.0 Technical Specification, 2004, 6-75.

* cited by examiner

*Primary Examiner*—Stephen M. Baker

(57) ABSTRACT

An interleaver address generator is provided with pruning avoidance technology. It anticipates the points in time when incorrect addresses are computed by an IAG, and bypasses these events. It produces a stream of valid, contiguous addresses for all specified code block sizes. A single address computation engine firstly 'trains' itself about violating generated addresses (for a related block size) during the initial H1 half-iteration of decoder operation, and then produces a continuous, correct stream of addresses as required by the turbo decoder. Thus regions of pruned addresses are determined, and then training is performed only in these regions. Thus, computation and population of a pruned event table is determined in less than 1/10 the time required to do a conventional style full training. The resulting pruned event table is compressed down to 256 bits.

24 Claims, 7 Drawing Sheets

Interleave Address Generator Structure

Input Sequences to Address Generator

Decoder 3GPP turbo interleaver address processor architecture.

3GPP turbo interleaver address pruning.

PRE-EMPTIVE INTERLEAVER ADDRESS GENERATOR FOR TURBO DECODERS

BACKGROUND OF THE INVENTION

1. Field of the Invention

The present invention relates to encoders and decoders for telecommunication systems. In particular, it relates to address generation in encoders and decoders for third generation (and later) telecommunications systems such as the third generation Universal Mobile Telecommunications System (3G/UMTS).

2. Background of Related Art

Third Generation (3G) Universal Mobile Telecommunications System (UMTS) designs offer mobile operators significant capacity and broadband capabilities to support great numbers of voice and data customers—especially in urban centers.

3G/UMTS has been specified as an integrated solution for mobile voice and data with wide area coverage. Universally standardized via the Third Generation Partnership Project (www.3gpp.org) and using globally harmonized spectrum in paired and unpaired bands, 3G/UMTS in its initial phase offers theoretical bit rates of up to 384 kbps in high mobility situations, rising as high as 2 Mbps in stationary/nomadic user environments. Symmetry between uplink and downlink data rates when using paired (FDD) spectrum also means that 3G/UMTS is ideally suited for applications such as real-time video telephony—in contrast with other technologies such as Asynchronous Digital Subscriber Line (ADSL) where there is a pronounced asymmetry between uplink and downlink throughput rates.

Specified and implemented as an end-to-end mobile system, 3G/UMTS also features the additional benefits of automatic international roaming plus integral security and billing functions, allowing operators to migrate from 2G to 3G while retaining much of the existing core network. Offering increased capacity and speed at lower incremental cost as compared with second generation mobile systems, 3G/UMTS gives operators the flexibility to introduce new multimedia services to business users and consumers while providing an enhanced user experience. This in turn provides the opportunity for operators to build on the brand-based relationships they already enjoy with their customers—and drive new revenue opportunities by encouraging additional traffic, stimulating new usage patterns and strengthening customer loyalty.

Ongoing technical work within 3GPP will see further increases in throughput speeds of the WCDMA Radio Access Network (RAN). High Speed Downlink Packet Access (HSDPA) and High Speed Uplink Packet Access (HSUPA) technologies are already standardized and are undergoing network trials with operators in the Far East and North America. Promising theoretical downlink speeds as high as 14.0 Mbps (and respectively 5.8 Mbps uplink), these technologies will play an instrumental role in positioning 3G/UMTS as a key enabler for true 'mobile broadband'. Offering data transmission speeds on the same order of magnitude as today's Ethernet-based networks that are a ubiquitous feature of the fixed-line environment, 3G/UMTS will offer enterprise customers and consumers all the benefits of broadband connectivity whilst on the move.

Third generation mobile radio systems such as W-CDMA and cdma2000 have adopted the use of turbo codes for channel coding due to their impressive performance. Previous turbo decoders had been developed for a single standard or for a fixed data rate, but flexible and programmable decoding is required for 3G communications because: 1) global roaming is recommended between different 3G standards, and 2) the frame size may change on a frame basis.

3G/UMTS systems include data encoders and decoders, and within the turbo encoder/decoder is a component called an interleaver address generator (IAG). The interleaver address generator is used to generate a sequence of data addresses for the encoding and/or decoding processes. The generated address sequence is used multiple times in a decoding process.

Interleavers make the implementation of a multi-standard turbo decoder difficult, as the operations and parameters of their generation rules are distinct and complex. Fortunately, the standards share the general concept of block interleavers that write data in a two-dimensional matrix row by row, permutes them, and reads them out column by column.

The current third generation partnership project (3GPP) UMTS cellular standard, (TS 25.212 V5.6 *"Multiplexing and Channel Coding Specification"*, 3GPP 2004) specifies an interleaver address pattern system for encoding and iterative turbo decoding. The turbo decoding process requires many iterations to produce a result. Each iteration that the turbo decoder runs can be considered in two parts—an H1 half-iteration where sequential addresses access the interleaver, and an H2 half-iteration where the generated interleaver address patterns access the interleaver. The 3GPP interleaver address pattern system produces a different address pattern for every possible block size, from length 40 to 5114 user information bits.

Interleaver address generators for 3GPP standards also have been implemented as lookup-tables where the address sequence for a particular block is computed off-chip. See Bickerstaff, M. et al., *"A 24Mb/s Radix-4 LogMAP Turbo Decoder for 3GPP-HSDPA Mobile Wireless"*, ISSCC 2003, paper 8.5, pp. 150-151. For instance, as explained in this reference, a software-based 3GPP turbo interleaver address generator simplifies the high complexity of the 3GPP turbo interleaving algorithm, resulting in decoders that use a large interleaver address table. The interleave address table is programmed by a host processor for each new block size (based on the current data rate, frame size, etc.) In a hardware IAG [e.g.: U.S. Pat. No. 6,851,039, U.S. patent appl. 20030221084], interleaver addresses are computed on the fly, enabling the decoder to switch block sizes quickly. This greatly reduces databus bandwidth (e.g., by a factor of 30), and computational load on the host, resulting in a more efficient multi-user system paritcularly for basestation applications.

FIG. 5 shows a conventional decoder turbo interleaver address processor architecture.

In particular, as shown in FIG. 5, the interleaver address processor architecture uses three small tables 502, 504, 506 to compute an interleaver address. The $r_j/r_{j+1}$ table 502 is a table of permuted prime integers implemented as a small combinatorial ROM. The T table 504, also implemented as a small combinatorial ROM, contains the inter-row permutation patterns. To change the turbo block size, the host or additional hardware populates a computed table 506 of base sequences for intra-row permutations (S table) with from 6 to 256 8-bit entries (block size dependent).

Due to the rectangular arrangement of interleave table, the specified IAG system can produce addresses that are outside the valid range of the related block size (e.g.: 2290 is outside the range for a block size of 2281). Such invalid addresses are typically removed from the generated sequence either by abandoning the invalid address and computing the correct address in the next clock cycle, or by replicating address computation hardware (with one engine generating address I, and the other engine generating the next address I+1 at the same time).

A conventional IAG can be trained to always produce a valid address sequence by performing a trial address generation during setup time to store row/column indexes of invalid (pruned) data addresses so it can avoid (or skip) these address during decoding, resulting in non-stop valid address generation. The IAG training starts in parallel with a $1^{st}$ half-iteration decoding process. Without optimization, the IAG training needs a memory of 239 words with 10 bits in each word, and finishes later than the $1^{st}$ half-iteration, thus causing a pause in each cycle of the decoding process. The result is slower decoding, use of more area, and higher power consumption.

Interleaver address generators for 3GPP standards have been implemented as 'on-the-fly' engines in an ASIC. See Bickerstaff, M. et al., "*A Unified Turbo/Viterbi Channel Decoder for 3GPP Mobile Wireless in 0.18 um CMOS*", IEEE JSSC V37 N11, Nov. 2002. (invited paper from ISSCC 2002). See also Shin, M-C., Park, I-C., "*A Programmable Turbo Decoder for Multiple 3G Wireless Standards*", ISSCC 2003, Paper 8.7, pp. 154-155.

A problem with an on-the-fly computation of interleaver addresses is referred to as "address pruning", which refers to the discarding of invalid addresses. Address pruning occurs when the required block size is not an integer multiple of the number of columns in the interleaver table, as depicted in FIG. 6.

In particular, FIG. 6 depicts conventional third generation partnership project (3GPP) turbo interleaver address pruning. In this case, the interleaver algorithm can produce addresses which are unused, and it is necessary to perform another computation to compute the next address. The interleaver algorithm preferably guarantees that there will never be two consecutive unused addresses. Thus, for an on-the-fly design, generating one valid address per clock cycle can be guaranteed by running two regular hardware IAGs (without a training feature) side by side so that at least one valid address is always available. By implementing two interleaver data paths in parallel, it is possible to guarantee one valid interleaver address every clock cycle and hence not stall the decoder. However, replicating the interleaver address generator engines (to mitigate throughput reduction) increases power consumption, gate count and complexity, because of the need for a relatively large interleaver address table.

In a look-up table IAG design, a guaranteed valid address sequence is computed by a processor and stored in a memory table, but this requires CPU intervention, additional chip area, and relatively high power consumption. Also, the process of discarding invalid addresses reduces the total effective throughput of the decoder. Moreover, the decoding time is slower due to typically slow software address calculations and to the loading of an address table.

The present invention introduces a new, faster method for training an interleaver address generator (IAG), and an efficient data structure for storing invalid (i.e., pruned) addresses, while solving conventional problems of slower decoding, required use of more surface area, and higher power consumption.

SUMMARY OF THE INVENTION

In accordance with the present invention, an interleaver address generator comprises an address computation module to generate coding addresses. A generation sequencer controls the address computation module in normal operation. A training sequencer controls the address computation module in a training mode to determine invalid coding addresses generated by the address computation module for a related block size. A pruning avoidance buffer controls the generation sequencer to bypass addresses determined in training to be invalid. A stream of valid, contiguous coding address are generated for all specified code block sizes.

In accordance with another aspect of the invention, a method and apparatus for efficiently generating interleaver addresses comprises performing a training mode in which an address generator is controlled to output required addresses for coding a related block size. Interleaver table locations (row/column indices) generating invalid addresses output from the address generator are stored into a pruning avoidance buffer during the training mode. A sequence of contiguous valid coding addresses is generated for the related block size from an address computation module. A stream of valid, contiguous coding address are generated for all specified code block sizes.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention trades time for gates in an interleaver address generator (IAG). It anticipates the points in time when incorrect addresses are computed by an IAG, and bypasses these events. It produces a stream of valid, contiguous addresses for all specified code block sizes. The invention uses a single address computation engine which firstly 'trains' itself about the location of invalid generated addresses (for a related block size) during the initial H1 half-iteration of decoder operation, and then produces a continuous, correct stream of addresses as required by the turbo decoder.

Moreover, the present invention determines regions of pruned addresses, and then performs training only in these regions. Thus, it allows computation and population of a pruned event table in less than ⅕ the time required to do a full training. The resulting pruned event table is compressed down to 256+2 bits.

Figure 1:
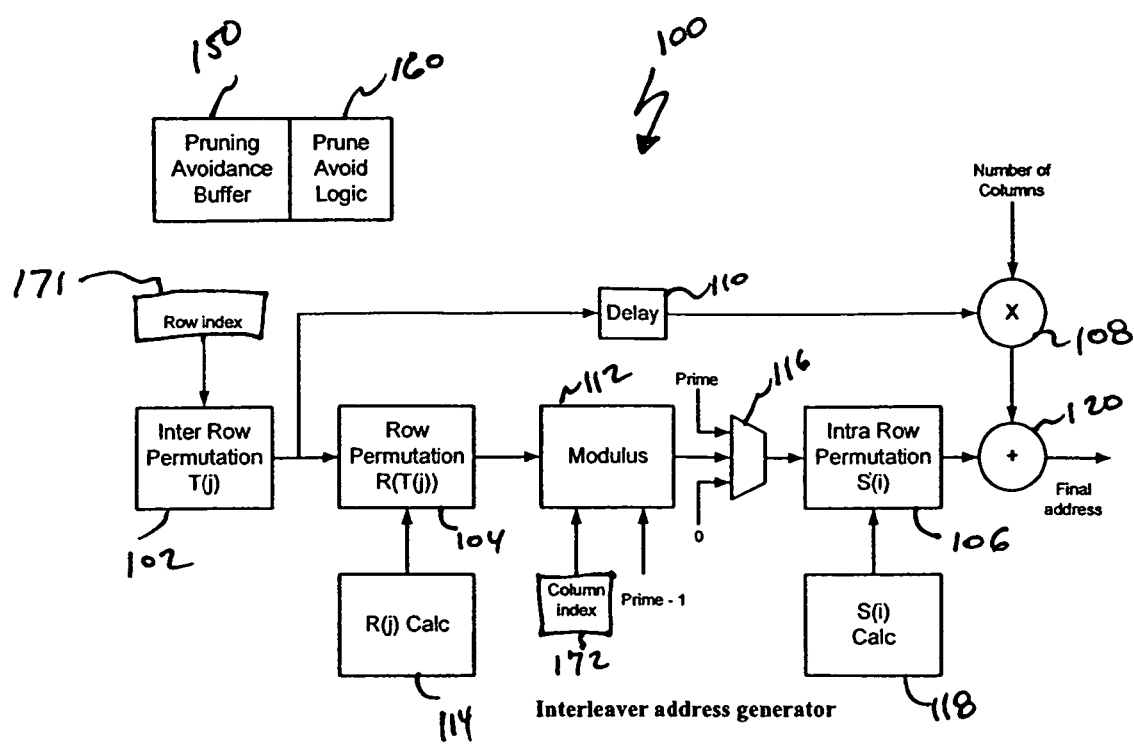
FIG. 1 shows architecture for an interleaver address generator, in accordance with the principles of the present invention.

FIG. 1 shows exemplary architecture for an interleaver address generator, in accordance with the principles of the present invention.

In particular, as shown in FIG. 1, an interleaver address generator (IAG) 100 is driven by a row index input, and a column index input.

The row index is input to an inter row permutation T(j) table 102. The output of the interrow permutation table 102 is input to a row permutation R(T(j)) table 104, and also to a multiplier function 108 (after a delay 110) that multiplies a number of columns.

The row permutation table 104 also has input from an R(j) calculation module 114. The output of the row permutation table 104 is input to a modulus function 112, as is a calculation of prime-1. A multiplexer 116 selects from between prime, the output of the module function 112, and zero. The output of the multiplexer is input to an intra row permutation S(i) table, which also has an input from an S(i) calculation module 118. The output of the intra row permutation table 106 is summed in a summer 120 with the output of the multiplier 108, to arrive at the final address. The inventive interleaver address generator 100 also includes pruning avoidance buffer 150, and prune avoid logic 160.

In accordance with the principles of the present invention, the row and column indices that produce the resultant interleaver addresses, that exceed the address range of the block length of interest, are stored in a pruning avoidance buffer (PAB) 150 during the training period.

Figure 2A:
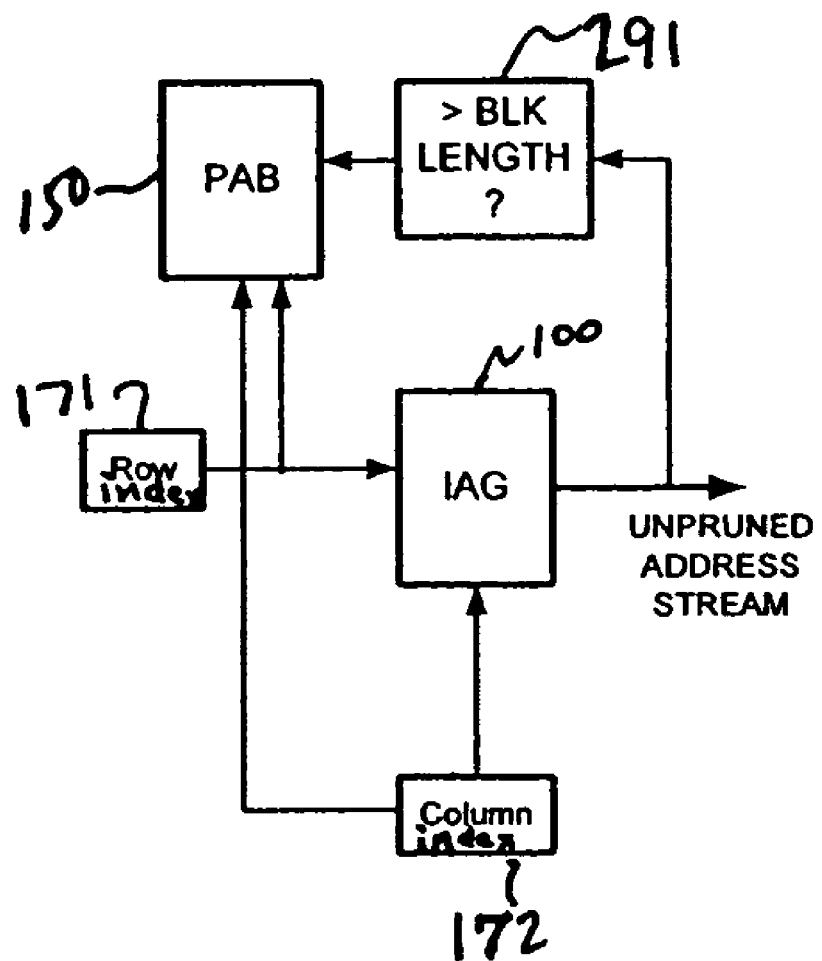
FIGS. 2A and 2B show pre-emptive interleaver address generator operation, in accordance with the principles of the present invention.
Figure 2B:
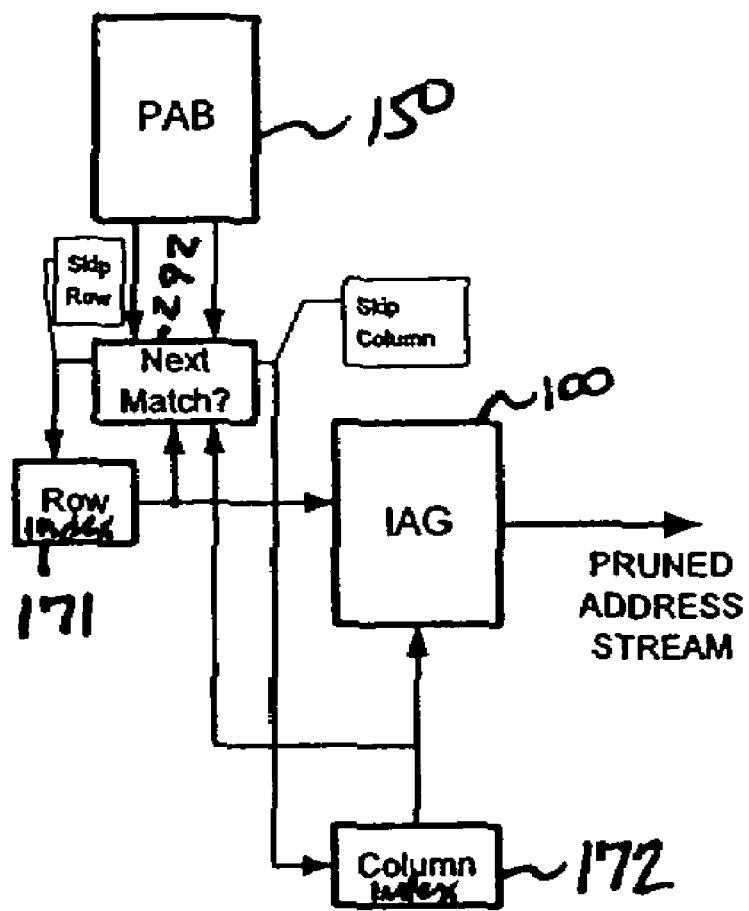

FIGS. 2A and 2B show pre-emptive interleaver address generator operation, in accordance with the principles of the present invention.

In particular, FIG. 2A depicts operation of the pruning avoidance buffer 150 and interleaver address generator 100 performed during a time in the turbo decoder's operation when the output of the interleaver address generator 100 is not required (the so-called initial H1 half-iteration). In this operation, the row index 171 and column index 172 are both input to the interleaver address generator 100, and an unpruned address stream is output.

The unpruned address stream is fed back through a block length module 291 that determines if the current address being output by the interleaver address generator 100 is greater than the length of the current block size. If so, the prune address buffer 150, which is also input with the row index 171 and column index 172, is triggered to store that row/column address in an appropriate memory.

FIG. 2B shows operation when the interleaver address generator 100 address sequence is required (i.e., pre-emptive operation). In such operation, the row index 171 and column index 172 counters progress through their regular sequencing driving the interleaver address generator 100 engine to produce addresses. The row index 171 and column index 172 are compared against the next imminent row/column index pair in the pruning avoidance buffer 150 in a next match functional module 292 to determine a next match. When a match with an entry in the pruning avoidance buffer 150 is about to occur in the next clock cycle, the relevant row or column index counter 171, 172 skips past that value. Therefore, the potential 'out-of-bounds' address is never generated, and the resultant address stream is seamless (i.e., without gaps).

Thus, the inventive interleaver address generator 100 with pruning avoidance technology typically has a number of pipeline stages, and invalid values moving around the pre-emptive interleaver address generator 100 are pre-empted/delayed, as appropriate.

As a result of the present invention, gate count is reduced as compared to a memory based design. Also, costs are reduced due to the requirements for reduced area usage as compared to memory or dual engine implementations. Moreover, power usage is reduced as compared to a dual engine architecture, and decoder throughput is maximized as it is uncompromised by wasted clock cycles in the interleaver address generator 100.

Figure 3:
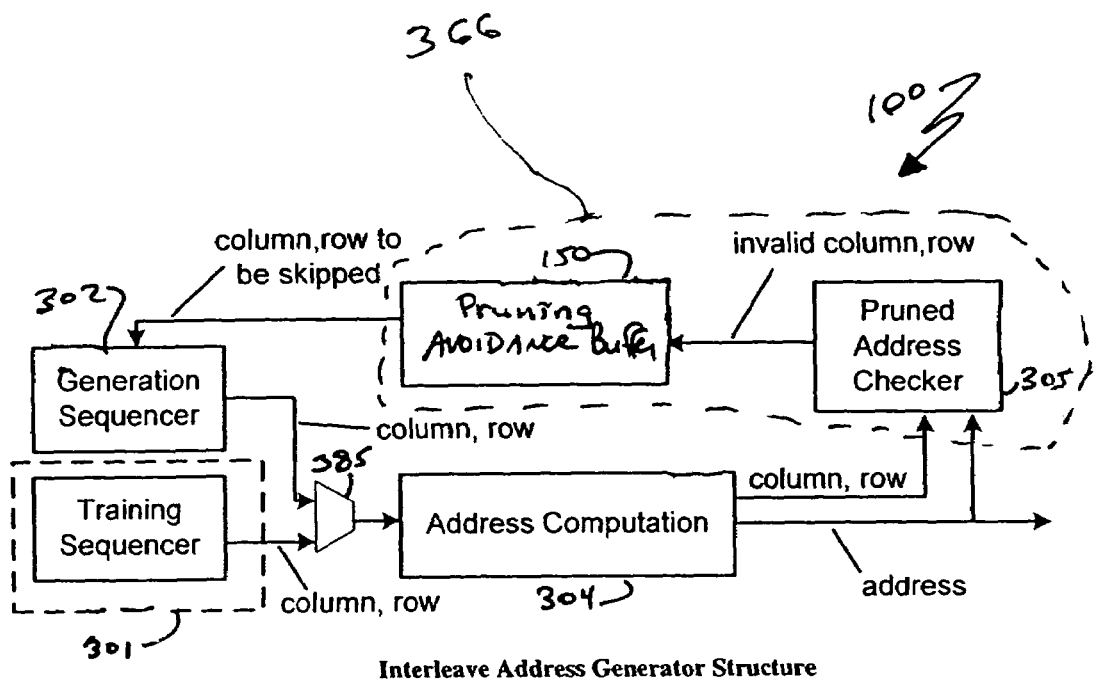
FIG. 3 shows detailed structure of an interleaver address generator including a pruning avoidance generator, in accordance with the principles of the present invention.

FIG. 3 shows detailed structure of an interleaver address generator 100 including a pruning avoidance generator 366, in accordance with the principles of the present invention.

In particular, as shown in FIG. 3, a training sequencer 301, a pruning avoidance buffer 150 and a pruned address checker 305, are added to otherwise conventional architecture.

In FIG. 3, an address computation module 304 is driven by either a generation sequencer 302 (normal operation), or by a training sequencer 301. Selection of either the generation sequencer 302 or the training sequencer 301 is made via multiplexer 385 or equivalent circuitry.

Column and row information is fed to a pruned address checker 305, as well as the final address output from the address computation module 304. Invalid column/row combinations trigger the pruning avoidance buffer 150 to store that column and row combination so that it is skipped by the generation sequencer 302 during normal operation.

In operation, when first in the training mode, the interleaver address generator 100 generates a sequence of addresses, checks if the addresses are valid with the pruned address checker 305, and stores any invalid event indices into a pruning avoidance buffer 150. Then, when in normal operation, invalid addresses are avoided and eliminated.

Figure 4:
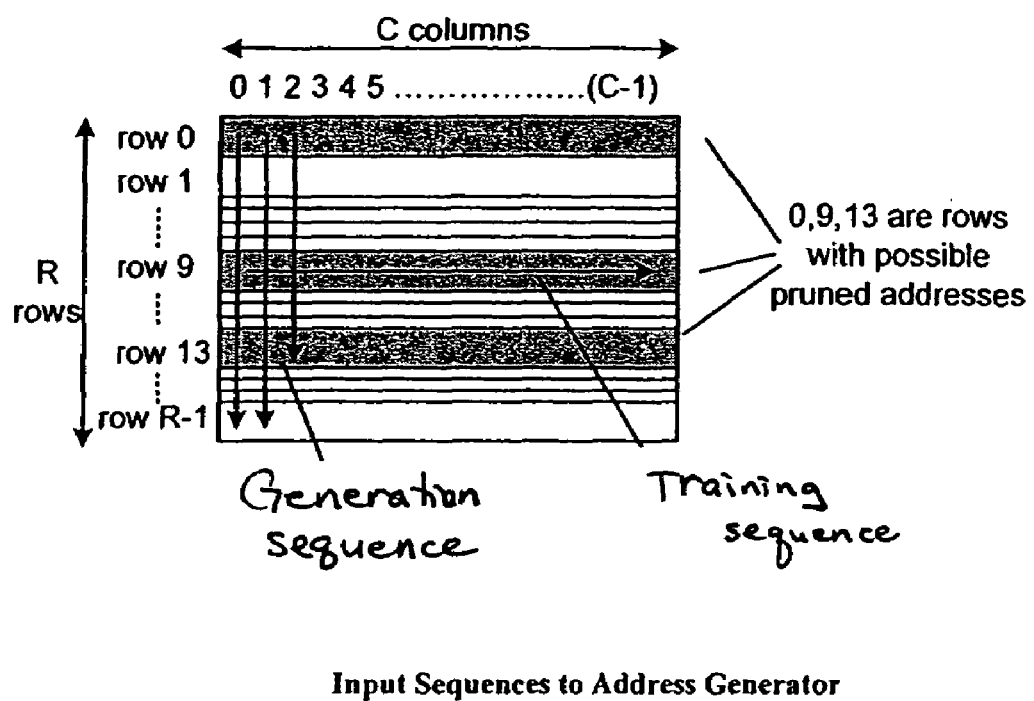
FIG. 4 shows input sequences to an interleaver address generator as in the present invention.
Figure 5:
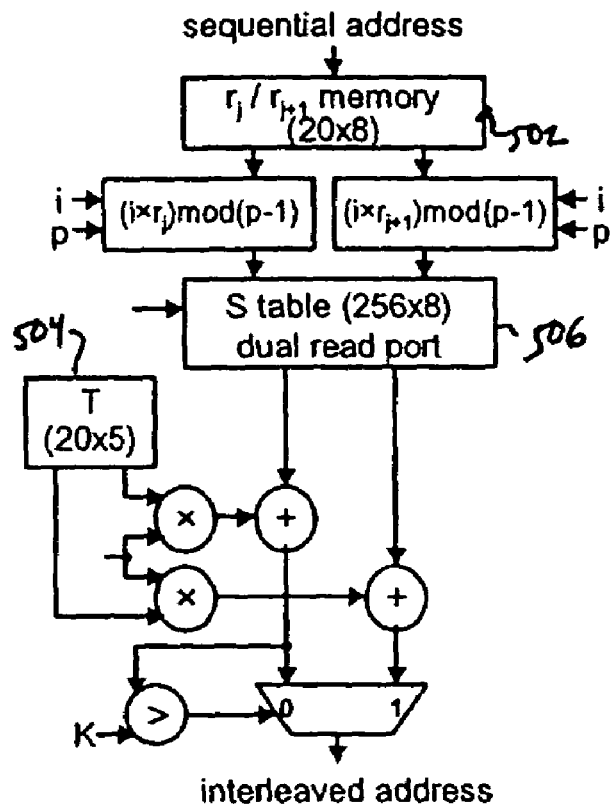
FIG. 5 shows a conventional decoder turbo interleaver address processor architecture.
Figure 6:
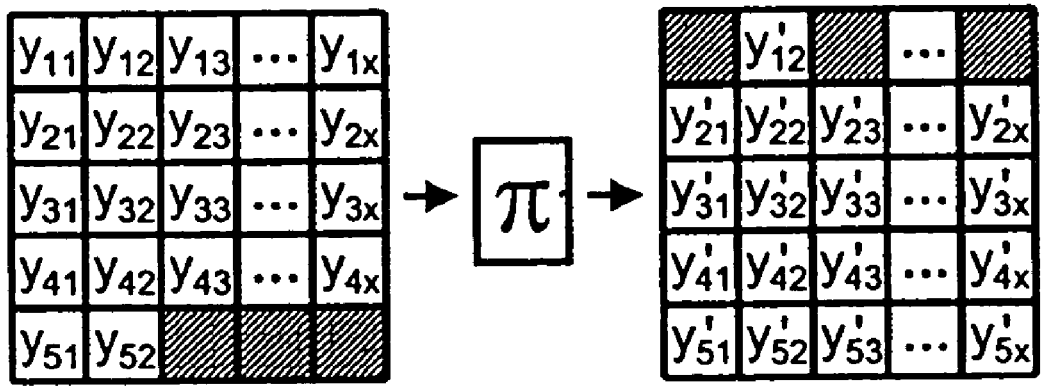
FIG. 6 depicts conventional third generation partnership project (3GPP) turbo interleaver address pruning.

FIG. 4 shows input sequences to an interleaver address generator built in accordance with the principles of the present invention.

In particular, in the generating mode, the pruning avoidance buffer 150 becomes a reference to the generation sequencer 302, anticipating which inputs to the address computation module 304 should be skipped during normal operation, i.e., during the generating mode. The input to the address computation module 304 is a series of row and column indexes output either by the generation sequencer 302 or by the training sequencer 301.

The address computation module 304 computes a pseudo-random address for each row and column input. There are up to R×C (5, 10 or 20)×(6-256) possible inputs for each block of data to decode, and some will result in pruned addresses.

FIG. 4 additionally shows two modes of operation—training and normal. During training, the row index is held fixed (at a particular row of interest, as is described below), while the column index in incremented, allowing training to be completed in C−1 a steps. Whereas, during normal operation row index is incremented with the column index incremented when the row index wraps around to zero. Thus, training is computed in substantially less time than it would take for a complete generation of interleaved addresses.

When the training mode is completed, the interleaver address generator 100 can enter the generating mode for continuous address generation. In the generating mode, the generation sequencer 302 generates a sequence of valid column-row combinations in column by column order with pre-emptive skips over the stored invalid column-row combinations as directed by row/column addresses trained and stored into the pruning avoidance buffer 150. In the exemplary embodiment, the training sequencer 301 and pruned address checker 305 need not be active during the generate mode, providing power savings.

Normally, the prune addresses are stored as an ordered list of up to 239 R, C indexes of 10 bits each. During training mode, the R, C indexes are found by the pruned address checker 305 and stored in an ordered list in the pruning avoidance buffer 150.

In the current 3GPP conforming embodiment, the pruning avoidance buffer requires a 2390 bit memory. However it is within the principles of the present invention to significantly reduce this memory requirement.

For instance, it is found by the present inventors that the values that end up in a pruning avoidance buffer 150 in accordance with the present invention have only a very limited range (e.g., row index={0, 9, 13}; column index={0 . . . 255}, worst case). In recognition of this result, it is seen that pruning avoidance buffer 150 values can be encoded in a number of ways to reduce storage. For instance, it is determined that for such a pruning avoidance buffer 150:

a. For all blocks lengths (K), only rows 0, 9 and 13 might contain pruned events.

b. If row 9 has one or more pruned event, the entire row 0 is pruned.

c. If row 13 has one or more pruned event, the entire row 0 and row 9 are pruned.

We can determine which rows (0, 9 or 13) contain pruned event(s) by computing R×C−K and looking at the range of the output. If R×C−K>2C, we know rows 0, 9 and 13 contain pruning events, if R×C−K>C we know rows 0 and 9 contain pruning events and if R×C−K is less than or equal to C, only row 0 may contain pruning events. Because only four possible combinations are required for identifying the prune rows (0, 9, 13 and 'not pruned'), the prune rows can be stored in a 2-bit register.

So, in all cases there is only 1 row in which some of the addresses are pruned, and this row is the row of interest (mentioned previously). This means that only the column indexes for the row in which some addresses are pruned need be stored, along with the row identifier. The last prune row (i.e., the row with some pruned addresses) can be calculated as follows:

$$\text{last prune row} = \begin{cases} 13, & \text{if} \quad R \times C > K + 2C \quad \text{else} \\ 9, & \text{if} \quad R \times C > K + C \quad \text{else} \\ 0, & \text{if} \quad R \times C > K \quad \text{else} \\ \text{no pruning} & (RC = K) \end{cases}$$

During training, the R and C indexes are generated by (1); the column indexes are 0 to C−1, and the last prune row is calculated by the expression above. Thus, instead of storing the indexes of the last prune row in an ordered memory (requiring 256×8 bits), a 256 bit register may be used to merely flag which columns are pruned, with each bit corresponding to a column with the same index. Furthermore, because only the locations are stored in the pruning avoidance buffer 150, an ordered list need not be maintained, and so training (of the last prune row) can be performed in arbitrary column order.

In accordance with the principles of the present invention, an interleaver address generator 100 including pruning avoidance technology is provided. The invention is advantageous in that the number of address computations is reduced from R×C down to C during the training sequence. On average, only 5.1% of the original, otherwise conventional time is required in accordance with this aspect of the invention. This saves power and improves the speed of decoding by eliminating the need for pausing the decoder.

Also, required memory may be reduced for storing invalid addresses from a possible 2390 bits down to 256+2 bits. This provides a smaller design as compared with prior art address tables and/or dual engine IAGs.

While the invention has been described with reference to the exemplary embodiments thereof, those skilled in the art will be able to make various modifications to the described embodiments of the invention without departing from the true spirit and scope of the invention.

What is claimed is:

1. An interleaver address generator, comprising:
    an address computation module to generate coding addresses;
    a generation sequencer to control said address computation module in normal operation;
    a training sequencer to control said address computation module in a training mode to determine invalid coding addresses generated by said address computation module for a related block size; and
    a pruning avoidance buffer to control said generation sequencer to bypass addresses determined in training to be invalid;
    wherein a stream of valid, contiguous coding address are generated for all specified code block sizes.

2. The interleaver address generator according to claim 1, wherein:
    said interleaver address generator is comprised in a communications system conforming to third generation partnership project (3GPP) standards.

3. The interleaver address generator according to claim 1, further comprising:
    a turbo decoder.

4. The interleaver address generator according to claim 3, wherein:
    said invalid coding addresses generated by said address computation module are determined during an initial H1 half-iteration of operation of a decoder.

5. The interleaver address generator according to claim 1, wherein:
    said training sequencer is operable to perform address training only in pruned address regions, said pruned address regions being significantly less than all addresses generated by said generation sequencer.

6. The interleaver address generator according to claim 5, wherein:
    said pruned address regions being those generated with row indices of 0, 9 and 13 only.

7. The interleaver address generator according to claim 1, further comprising:
    a pruned event table created by said training sequencer.

8. The interleaver address generator according to claim 7, wherein:
    said pruning avoidance buffer is compressed down to 1-bit per column.

9. A method of efficiently generating interleaver addresses, comprising:
    performing a training mode in which an address generator is controlled to output required addresses for coding a related block size;
    storing any invalid addresses output from said address generator during said training mode into a pruning avoidance buffer; and
    generating a sequence of contiguous valid coding addresses for said related block size from an address computation module;
    wherein a stream of valid, contiguous coding address are generated for all specified code block sizes.

10. The method of efficiently generating interleaver addresses according to claim 9, wherein:
    said training mode is performed during an initial H1 half-iteration of operation of a decoder.

11. The method of efficiently generating interleaver addresses according to claim 9, wherein:
    said training mode is operable to perform address training only in pruned address regions, said pruned address regions being significantly less than all addresses generated during said step of generating a sequence of contiguous valid coding addresses.

12. The method of efficiently generating interleaver addresses according to claim 9, wherein:
said pruned address regions are those generated with row indices of 0,9 and 13 only.

13. The method of efficiently generating interleaver addresses according to claim 9, wherein:
said pruned avoidance buffer is compressed down to 1-bit per column.

14. The method of efficiently generating interleaver addresses according to claim 9, wherein:
only a subset of all possible addresses is generated in said full sequence.

15. The method of efficiently generating interleaver addresses according to claim 14, wherein:
said interleaver addresses are generated in a communications system conforming to third generation partnership project (3GPP) standards.

16. The method of efficiently generating interleaver addresses according to claim 14, wherein:
said interleaver addresses are generated in a turbo decoder.

17. Apparatus for efficiently generating interleaver addresses, comprising:
means for performing a training mode in which an address generator is controlled to output required addresses for coding a related block size;
means for storing any invalid addresses output from said address generator during said training mode into a pruning avoidance buffer; and
means for generating a sequence of contiguous valid coding addresses for said related block size from an address computation module;
wherein a stream of valid, contiguous coding address are generated for all specified code block sizes.

18. The apparatus for efficiently generating interleaver addresses according to claim 17, wherein:
said interleaver addresses are generated in a turbo decoder.

19. The apparatus for efficiently generating interleaver addresses according to claim 17, wherein:
said means for performing said training mode is operable during an initial H1 half-iteration of operation of a decoder.

20. The apparatus for efficiently generating interleaver addresses according to claim 17, wherein:
said pruned address regions are those generated with row indices of 0, 9 and 13 only.

21. The apparatus for efficiently generating interleaver addresses according to claim 17, wherein:
said pruned avoidance buffer is compressed down to 1-bit per column.

22. The apparatus for efficiently generating interleaver addresses according to claim 17,wherein:
only a subset of all possible addresses is generated in said full sequence.

23. The apparatus for efficiently generating interleaver addresses according to claim 22, wherein:
said apparatus conforms to third generation partnership project (3GPP) standards.

24. The apparatus for efficiently generating interleaver addresses according to claim 23, wherein:
said means for performing said training mode is operable to perform address training only in pruned address regions, said pruned address regions being significantly less than all addresses generated during said step of generating a sequence of contiguous valid coding addresses.

* * * * *